(12) United States Patent
Suntola et al.

(10) Patent No.: US 6,572,705 B1
(45) Date of Patent: Jun. 3, 2003

(54) METHOD AND APPARATUS FOR GROWING THIN FILMS

(75) Inventors: Tuomo Suntola, Espoo (FI); Sven Lindfors, Espoo (FI)

(73) Assignee: ASM America, Inc., Phoenix, AZ (US)

( * ) Notice: Subject to any disclaimer, the term of this patent is extended or adjusted under 35 U.S.C. 154(b) by 0 days.

(21) Appl. No.: 09/482,625

(22) Filed: Jan. 14, 2000

Related U.S. Application Data (63) Continuation of application No. 08/682,705, filed as application No. PCT/FI95/00658 on Nov. 28, 1995, now Pat. No. 6,015,590.

(30) Foreign Application Priority Data

Nov. 28, 1994  (FI) .................................................. 945611

(51) Int. Cl.[7] .............................................. C23C 16/00
(52) U.S. Cl. ...................... 118/702; 118/715; 118/719; 118/696; 118/698; 118/699
(58) Field of Search ................................. 118/715, 719, 118/725, 696, 698, 699, 702, 703, 706

(56) References Cited

U.S. PATENT DOCUMENTS

| | | | |
|---|---|---|---|
| 3,730,696 A | | 5/1973 | Pointu et al. .................. 65/30 |
| 4,058,430 A | * | 11/1977 | Suntola et al. .......... 427/255.13 |
| 4,062,318 A | | 12/1977 | Ban et al. ..................... 118/49 |

(List continued on next page.)

FOREIGN PATENT DOCUMENTS

| | | | |
|---|---|---|---|
| DE | 31 48 620 C2 | 5/1981 | |
| DE | 37 39 528 A1 | 11/1987 | |
| DE | 39 36 016 A1 | 10/1989 | |
| EP | 0015390 A1 | 9/1980 | |
| EP | 0 273 470 A3 | 7/1988 | ........... C23C/16/44 |
| EP | 0 379 594 A1 | 8/1990 | ........... C23C/16/44 |
| EP | 0559326 A1 | 9/1993 | |
| JP | 51-77589 | 7/1976 | |
| JP | 55-130896 | 10/1980 | |
| JP | 61-26217 | 2/1986 | |
| JP | 61-289623 | 12/1986 | |
| JP | 1-264993 | 10/1989 | |
| JP | 1-305524 | * 12/1989 | |
| JP | 6-216030 | 8/1994 | |

OTHER PUBLICATIONS

Claim Construction of United States patents Nos. 6,015,590, 5,916,365 and 5,294,568; filed Aug. 15, 2002.

Manual for the F–120 ALE reactor, "F–120 ALE REACTOR SPECIFICATION, Rev. 01", *Advanced thin Film Technology and surface Chemistry by Atomic Level Control*, Microchemistry LTD, 16 pages.

(List continued on next page.)

*Primary Examiner*—Jeffrie R. Lund
(74) *Attorney, Agent, or Firm*—Knobbe, Martens, Olson & Bear LLP.

(57) ABSTRACT

The invention relates to a method and apparatus for growing a thin film onto a substrate, in which method a substrate placed in a reaction space (21) is subjected to alternately repeated surface reactions of at least two vapor-phase reactants for the purpose of forming a thin film. According to the method, said reactants are fed in the form of vapor-phase pulses repeatedly and alternately, each reactant separately from its own source, into said reaction space (21), and said vapor-phase reactants are brought to react with the surface of the substrate for the purpose of forming a solid-state thin film compound on said substrate. According to the invention, the gas volume of said reaction space is evacuated by means of a vacuum pump essentially totally between two successive vapor-phase reactant pulses. By virtue of transporting the different starting material species at different times through the apparatus effectively isolates the starting materials from each other thus preventing their premature mutual reactions.

19 Claims, 2 Drawing Sheets

U.S. PATENT DOCUMENTS

| | | | | |
|---|---|---|---|---|
| 4,263,872 A | | 4/1981 | Ban | 118/721 |
| 4,339,645 A | | 7/1982 | Miller | 219/10.49 R |
| 4,389,973 A | | 6/1983 | Suntola et al. | 118/725 |
| 4,413,022 A | | 11/1983 | Suntola et al. | 427/255.2 |
| 4,421,786 A | | 12/1983 | Mahajan et al. | 428/82 |
| 4,533,820 A | * | 8/1985 | Shimizu | 219/411 |
| 4,689,247 A | * | 8/1987 | Doty et al. | 427/126.1 |
| 4,825,806 A | | 5/1989 | Tawada et al. | 118/719 |
| 4,836,138 A | * | 6/1989 | Robinson et al. | 118/666 |
| 4,861,417 A | | 8/1989 | Mochizuki et al. | 156/610 |
| 4,876,218 A | | 10/1989 | Pessa et al. | 437/107 |
| 4,920,918 A | * | 5/1990 | Adams et al. | 118/724 |
| 4,975,252 A | * | 12/1990 | Nishizawa et al. | 118/688 |
| 4,976,996 A | * | 12/1990 | Monkowski et al. | 427/255.5 |
| 4,993,357 A | | 2/1991 | Scholz | 118/715 |
| 4,993,360 A | * | 2/1991 | Nakamura | 118/719 |
| 5,038,711 A | | 8/1991 | Dan et al. | 118/715 |
| 5,091,335 A | | 2/1992 | Grunthaner et al. | 437/108 |
| 5,183,510 A | | 2/1993 | Kimura | 118/719 |
| 5,194,401 A | * | 3/1993 | Adams et al. | 437/173 |
| 5,221,556 A | * | 6/1993 | Hawkins et al. | 427/255 |
| 5,270,247 A | * | 12/1993 | Sakuma et al. | 437/133 |
| 5,336,327 A | * | 8/1994 | Lee | 118/730 |
| 5,370,738 A | * | 12/1994 | Watanabe et al. | 118/725 |
| 5,395,791 A | | 3/1995 | Cheng et al. | 437/105 |
| 5,429,068 A | | 7/1995 | Sakuma | 117/88 |
| 5,695,567 A | * | 12/1997 | Kordina et al. | 118/725 |
| 5,711,811 A | * | 1/1998 | Suntola et al. | 118/711 |
| 6,015,590 A | * | 1/2000 | Suntola et al. | 427/255.23 |

OTHER PUBLICATIONS

Garache et al., "Deposit and Clean Deposition System" *IBM Technical Disclosure Bulletin*, vol. 13, No. 7, Dec. 1970, p. 2083.

Suntola, "Atomic Layer Epitaxy," *Thin Solid Films*, 216, 1992, pp. 84–89.

Patent Abstracts of Japan, vol. 12, No. 358, C–531, abstract of JP A 63–112495, May 17, 1988.

Patent Abstracts of Japan, vol. 8, No. 225, C–247, abstract of JP A 59–111997, Jun. 28, 1984.

* cited by examiner

Fig. 2

METHOD AND APPARATUS FOR GROWING THIN FILMS

REFERENCE TO RELATED APPLICATIONS

The present application is a continuation of U.S. application Ser. No. 08/682,705, filed Sep. 25, 1996, issued Jan. 18, 2000 as U.S. Pat. No. 6,015,590, which is the National Phase U.S. application of PCT application No. PCT/FI95/00658, filed Nov. 28, 1995 claiming the priority benefit under 35 U.S.C. §119 from Finnish Application No. 945611, filed Nov. 28, 1994.

FIELD OF THE INVENTION

The present invention relates to a method for growing thin films on substrates in a reaction space by alternate repeated reactions of at least two vapor phase reactants with the substrates.

In the present method, the substrate is typically located in a reaction space, wherein it in accordance with the Atomic Layer Epitaxy (ALE) method is subjected to alternately repeated surface reactions of at least two different reactants. According to the present method, the reactants are admitted repetitively and alternately each reactant at a time from its own source in the form of vapor-phase pulses into the reaction space. Here, the vapor-phase reactants are allowed to react with the substrate surface for the purpose of forming a solid-state thin film on the substrate.

While the method is most appropriately suited for producing so-called compound thin films using as the reactants such starting materials that contain component elements of the desired compound thin-film, it may also be applied to growing elemental thin films. Of compound films typically used in the art, reference can be made to ZnS films employed in electroluminescent displays, whereby such films are grown on a glass substrate using zinc sulfide and hydrogen sulfide as the reactants in the growth process. Of elemental thin films, reference can be made to silicon thin films.

The invention also concerns an apparatus suited for producing thin films comprising a reaction chamber with gas flow channels suited for an inflow of vapor phase reactant pulses and an outflow of reaction products, wherein at least a portion of the gas flow channels have a narrow, oblong cross-section for minimizing the volume of the reaction space.

The apparatus comprises a reaction space into which the substrate can be placed, and at least two reactant sources from which the reactants used in the thin-film growth process can be fed in the form of vapor-phase pulses into the reaction space. The sources are connected to the reaction space via reactant inflow channels, and outflow channels are connected to the reaction space for removing the gaseous reaction products of the thin-film growth process as well as the excess reactants in vapor phase.

BACKGROUND AND SUMMARY OF THE INVENTION

Conventionally, thin-films are grown using vacuum evaporation deposition, the Molecular Beam Epitaxy (MBE) and other vacuum deposition methods, different variants of the Chemical Vapor Deposition (CVD) method, including low-pressure and metal-organic CVD and plasma-enhanced CVD, or alternatively, the above-described deposition method of alternately repeated surface reactions called the Atomic Layer Epitaxy (ALE) method. In the MBE and CVD methods, besides other process variables, the thin-film growth rate is also affected by the concentrations of the starting material inflows. To achieve a uniform thickness of the layers deposited by the first category of conventional methods, the concentrations and reactivities of starting materials must hence be carefully kept constant all over the substrate area. If the starting materials are allowed to mix with each other prior to reaching the substrate surface as is the case in the CVD method, for instance, a chance of their premature mutual reaction arises. Then, the risk of microparticle formation already within the inflow channels of the gaseous reactants is imminent. Such microparticles have a deteriorating effect on the quality of the thin film growth. Therefore, the possibility of premature reactions in MBE and CVD reactors is avoided by heating the starting materials no earlier than at the substrate surfaces. In addition to heating, the desired reaction can be initiated using, e.g., a plasma or other similar activating means.

In the MBE and CVD processes, the growth of thin films is primarily adjusted by controlling the inflow rates of starting materials impinging on the substrate. By contrast, the ALE process is based on allowing the substrate surface qualities rather than the starting material concentrations or flow variables to control the deposition rate. The only prerequisite in the ALE process is that the starting material is available in sufficient concentration for thin-film formation on all sides of the substrate.

The ALE method is described in the FI patent publications 52,359 and 57,975 and in the U.S. Pat. Nos. 4,058,430 and 4,389,973, in which also some apparatus embodiments suited to implement this method are disclosed. Apparatus constructions for growing thin films are also to be found in the following publications: Material Science Reports 4(7) (1989), p. 261, and Tyhjiötekniikka (Finnish publication for vacuum techniques), ISBN 951-794-422-5, pp. 253–261.

In the ALE growth method, atoms or molecules are arranged to sweep over the substrates, thus continuously impinging on their surface so that a fully saturated molecular layer is formed thereon. According to the conventional techniques known from the FI patent publication No. 57,975, the saturation step is followed by an inert gas pulse forming a diffusion barrier which sweeps away the excess starting material and the gaseous reaction products from above the substrate. The successive pulses of different starting materials and of diffusion barriers of an inert gas separating the former accomplish the growth of the thin film at a rate controlled by the surface chemistry properties of the different materials. Such a reactor is called a "traveling-wave" reactor. For the function of the process it is irrelevant whether the gases or the substrates are moved, but rather, it is imperative that the different starting materials of the successive reaction steps are separated from each other and arranged to impinge on the substrate successively.

Most vacuum evaporators operate on the so-called "single-shot" principle. Herein, a vaporized atom or molecule species can impinge on the substrate only once. If no reaction of the species with the substrate surface occurs, the species is bounced or re-vaporized so as to hit the apparatus walls or the inlet to the vacuum pump undergoing condensation therein. In hot-wall reactors, an atom or molecule species impinging on the reactor wall or the substrate may become re-vaporized, whereby advantageous conditions are created for repeated impingements of the species on the substrate. When applied to ALE reactors, this "multi-shot" principle can provide, i.a. improved material utilization efficiency.

In conventional ALE apparatuses, a characterizing property is that the different starting materials of the reaction are understood to be isolated from each other by means of a diffusion wall formed by an inert gas zone traveling between two successive pulses of starting materials, cf. above-cited FI patent publication No. 57,975 and the corresponding U.S. Pat. No. 4,389,973. The length of the inert gas zone acting as the downstream flowing diffusion wall is such that only approx. one millionth of the reactant gas molecules have a sufficient diffusion velocity to travel under the prevailing conditions in the counterflow direction to a distance greater than the thickness of the isolating diffusion wall employed in the method.

However, notwithstanding the high reliability of the above-described arrangement, it has some disadvantages. For instance, the cross sections and shapes of piping in practical reactor constructions vary between, e.g., the infeed manifold and the substrates, whereby the thickness and shape of the diffusion wall become difficult to control and the starting materials may become carried over into contact with each other. The diffusion wall may also become destroyed in the nozzles feeding the vapor-phase reactant to the substrates, in gas mixers or at other discontinuity points of the piping. The laminarity of gas inflow may also become disturbed by a too tight bend in the piping.

Intermixing of starting materials in flow systems cannot be prevented simply by keeping the gas volumes apart from each other, because mixing may also occur due to adherence of molecules from a starting material pulse on the apparatus walls or discontinuities thereof, wherefrom the molecules may then gain access with the molecules of the successive starting material pulse.

It is an object of the present invention to overcome the drawbacks of conventional technology and to provide an entirely novel arrangement for growing thin films.

The goal of the invention is achieved by virtue of admitting vapor-phase pulses of the starting material reactants into the ALE reactor so that each starting material pulse is individually driven through the piping and reaction space of the apparatus isolated from the other pulses. According to the invention, this concept is implemented by means of purging the gas volume of the reaction space containing reactive gas between two successive vapor-phase pulses essentially entirely, which means a purging efficiency of at least 99%, preferably 99.99%. Thence, all the reacting gas, which in practice refers to the entire gas volume filled with the vapor-phase reactant, is purged from the reaction space between the successive pulses. The reactant pulses of different starting materials will thus remain isolated from each other, whereby no mixing of the reactants can occur.

In the apparatus suited to implement the method, the outflow channels are connected to a pump capable of evacuating the reaction space to a vacuum, whereby the pump capacity is dimensioned sufficiently high to permit full evacuation of a volumetric amount of gas corresponding to the gas volume of the reaction space out from the reaction space during the interval between two successive vapor-phase reactant pulses. Accordingly, the pump must have a volumetric flow capacity per time unit, advantageously over the interval between two successive vapor-phase reactant pulses, that is greater than the gas volume of the reaction space.

More specifically the method according to the invention is principally characterized by a reaction space in which the gas volume is evacuated essentially totally between two successive vapor phase reactant pules.

Furthermore, the apparatus according to the invention is principally characterized by a reaction chamber with gas flow channels suited for an inflow of vapor phase reactant uses and an outflow of reaction products, wherein at least a portion of the gas flow channels have a narrow, oblong cross-section for minimizing the volume of the reaction space.

In the context of the present invention, the term "evacuation" is used generally referring to the removal of reactant residues in the vapor phase. The evacuation of the reaction space can be accomplished by purging the gas volume of the apparatus by means of at least one pumping cycle capable of lowering the internal pressure in the apparatus to a sufficiently high vacuum. When required, the apparatus may be simultaneously filled with an inactive gas which promotes the purging of the reactant residues from the reaction space.

In the present context, the term "inactive" gas is used to refer to a gas which is admitted into the reaction space and is capable of preventing undesired reactions related to the reactants and the substrate, respectively. Such reactions include the reactions of the reactants and the substrate with possible impurities, for instance. The inactive gas also serves for preventing reactions between the substances of the different reactant groups in, e.g., the inflow piping. In the method according to the invention, the inactive gas is also used advantageously as the carrier gas of the vapor-phase pulses of the reactants. According to a preferred embodiment, in which the reactants of the different reactant groups are admitted via separate inlet manifolds into the reaction space, the vapor-phase reactant pulse is admitted from one inflow channel while the inactive gas is admitted from another inflow channel, thus preventing admitted reactant from entering the inflow channel of another reactant. Of inactive gases suited for use in the method, reference can be made to inert gases such as nitrogen gas and noble gases, e.g., argon. The inactive gas may also be an inherently reactive gas such as hydrogen gas serving to prevent undesirable reactions, e.g., oxidization reactions, from occurring on the substrate surface.

According to the invention, the term "reaction space" includes both the space in which the substrate is located and in which the vapor-phase reactants are allowed to react with the substrate in order to grow thin films, namely, the reaction chamber, as well as the gas inflow/outflow channels communicating immediately with the reaction chamber, said channels serving for admitting the reactants into the reaction chamber, inflow channels, or removing the gaseous reaction products of the thin-film growth process and excess reactants from the reaction chamber, outflow channels. According to the construction of the embodiment, the number of the inflow and outflow channels, respectively, can be varied from one upward. According to the invention, the reaction space is the entire volume to be evacuated between two successive vapor-phase pulses.

In the present context, the term "reactant" refers to a vaporizable material capable of reacting with the substrate surface. In the ALE method, reactants belonging in two different groups are conventionally employed. The reactants may be solids, liquids or gases. The term "metallic reactants" is used of metallic compounds which may even be elemental metals. Suitable metallic reactants are the halogenides of metals including chlorides and bromides, for instance, and metal-organic compounds such as the thd complex compounds. As examples of metallic reactants may be mentioned Zn, $ZnCl_2$, $TiCl_4$, $Ca(thd)_2$, $(CH_3)_3Al$ and $Cp_2Mg$. The term "nonmetallic reactants" is used for compounds and elements capable of reacting with metallic compounds. The latter group is appropriately represented by water, sulfur, hydrogen sulfide and ammonia.

Herein, the term "substrate surface" is used to denote that top surface of the substrate on which the vapor-phase reactant flowing into the reaction chamber first impinges. In practice, said surface during the first cycle of the thin-film growing process is constituted by the surface of the substrate such as glass, for instance; during the second cycle the surface is constituted by the layer comprising the solid-state reaction product which is deposited by the reaction between the reactants and is adhered to the substrate, etc.

As mentioned above, in a practical embodiment the vapor-phase reactants are conventionally driven by a carrier gas flow into the reaction chamber and further through it. Therefore, the vapor-phase reactant obtained from a source is mixed with the inert gas flow at some point of the apparatus. In the present embodiment, the term "reaction space gas flow channels" also includes that section of the reactant inflow pipes which is located after the control valves of the inactive gas flow.

A characterizing property of the present invention is that the different starting materials are not allowed to flow simultaneously in the piping or reactor (reaction space), but rather, the piping and reaction space are evacuated from the contents of the preceding vapor-phase pulse prior to the admission of the next vapor-phase pulse. Advantageously, the controls are set such that the interval between successive pulses is kept so long as to permit the evacuation of the reaction space using at least a double or triple purging gas volume during the interval between pulses. To achieve maximally efficient evacuation of reactant residues, the reaction space is purged with an inactive gas during the interval between the reactant pulses and the total volume of gas evacuated from the reaction space during the interval between the reactant pulses amounts to at least 2–10 times the volume of the reaction space. A design target value of less than 1%, advantageously less than 1‰, of residual components of the preceding vapor-phase reactant pulse remaining at the infeed of the next pulse can be set for the evacuation efficiency. Operation according to the invention can easily reach a situation in which the reaction space is purged to less than 1 ppm of reactant residues from the preceding pulse.

According to the present method, evacuation is most advantageously implemented by connecting the reaction space to a pump whose volumetric capacity during the interval between two successive vapor-phase reactant pulses is appreciably greater than the gas volume of the reaction space. As the interval between two successive reactant gas pulses typically is in the order of 1 s, this requirement can be met by connecting such a pump to the reaction space that has a capacity sufficient to evacuate during said interval a volumetric amount of gas which is advantageously at least 2–3 times, and particularly advantageously 4–10 times the volume of the reaction space.

The invention can be implemented using any suitable pump capable of establishing a sufficient vacuum in the reaction space and having a sufficient capacity. Examples of suitable pump types are: rotary vacuum pump, Roots' blower and turbo pump.

To achieve efficient evacuation, the apparatus according to the invention has a design characterized by minimized volumes and piping cross sections implemented in a construction with minimized number of seams. The piping layout aims to avoid any structures which could disturb the laminarity of the flow pattern or act as difficult-to-purge gas pockets.

In conventional equipment constructions the above-described goals are difficult to achieve, since gas volumes in the equipment are relatively large in relation to the volume occupied by the products and the gas flow occur via complicated paths. Obviously, a mere diffusion wall cannot purge all gas pockets contained therein. The problems are accentuated in equipment designed for simultaneous thin film growth on multiple substrates.

The present invention discloses a plurality of special properties contributing to the minimization of apparatus gas volume and the formation tendency of spalling films (microparticles). Simultaneously, the invention provides a particularly advantageous embodiment of an apparatus suited for simultaneous deposition of thin films on two or more substrates.

An advantageous approach to reduce equipment contamination is to feed each reactant group via a separate inflow channel directly into the reaction chamber. Preferably, the reactant is allowed to become mixed with a carrier gas flow entering from the inflow channel of another reactant group prior to contacting the reactant with the substrate. The purpose of such mixing is to homogenize the gas flow passing over the substrate.

The above-described embodiment is particularly well suited for thin-film growth processes using at least two compound component reactants. The exit ends of the inflow channels of the different reactant groups, later in the text called the reactant "infeed openings", are adapted to exit into the reaction chamber, close to the substrates of the thin film structures. Between the infeed openings is herein disposed a baffle which prevents the reactant inflow from one infeed opening from entering directly the infeed opening of another reactant belonging to a different reactant group. To eliminate the risk of reactant contamination, a carrier gas flow is hereby particularly advantageously driven through that inflow channel or channels which is/are currently not used for the infeed of a reactant. Preferably, the reactant infeed openings are disposed on the opposite sides of the baffle and the reactant inflows are directed perpendicularly against the baffle, whereby the gas flow can be spread into an essentially planar flow producing a "flattened" flow pattern. The carrier gas flow and the vapor-phase reactant flow entering from the opposite directions, respectively, that are flattened by hitting the baffle are combined prior to taking their mixed flow into contact with the substrate. It has been found that the intermixing of different species by diffusion is extremely efficient between the flattened gas flows resulting in excellent uniformity of the gas flow taken to the substrate.

According to an alternative embodiment, the gas volume of the apparatus is minimized by designing those gas flow channels which communicate with the reaction chamber to have a narrow, oblong cross section in order to minimize the volume of the reaction space. Hence, the gas flow channels have a "flat" shape capable of producing a similar flattened gas flow pattern as in the arrangement of the above-described embodiment.

Typically, the flat gas flow channel according to the invention has a cross section with a width, orthogonal to the flow direction of the gas pulse front, of approx. 1–100 times the channel height. Advantageously, the width-to-height ratio is approx. 5:1–50:1, typically approx. 30:1–5:1.

In both of the above-described embodiments, the reaction chamber enclosing the substrate is particularly advantageously designed to have the chamber walls disposed close to the substrate being processed. The inner top wall of the chamber is advantageously aligned parallel to the substrate top surface. In fact as noted earlier, the inner top wall of the chamber may be formed by another substrate.

Minimization of the gas volume in the apparatus improves the utilization efficiency of reactants as a single reaction space can be simultaneously used for growing thin film onto at least two substrates. According to the invention, this arrangement can be implemented by placing the substrates in separate reaction chambers which are stacked vertically or horizontally to provide a reaction chamber pack in which the chambers have common gas flow channels in order to minimize the total volume of the reaction space. The number of vertically or horizontally stacked reaction chambers may be from 2 to 100 and as each of the chambers can be used for processing at least two substrates simultaneously, the total number of thin-film surfaces being processed may be varied in the range of 2–200, for instance.

According to a particularly advantageous embodiment, the apparatus according to the invention comprises vertically or horizontally stacked planar elements, whereby said elements have recesses/grooves corresponding to the reaction chambers and gas flow channels machined to them and at least a number of said elements is mutually identical. The edge areas of the planar elements are provided with round, or alternatively, oblong notches or openings extending through the planar element and forming said gas flow channels of said reaction space when said planar elements are stacked vertically or horizontally in order to form a reaction chamber pack. The number of the round openings on the reactant inflow side is advantageously one per each reactant group, which in practice means two openings. The number of oblong openings required on the outflow side is only one.

The center parts of the planar elements can be provided with areas recessed from the plane of the element so that the recesses are connected at their reactant inflow and outflow sides, respectively, to said notches or openings. The recessed areas form the reaction chamber of the reaction space, or a portion thereof. The flow connections between the recessed areas and the gas flow channels act as restrictions to the gas flows. The recessed areas of the element may be made so deep as to extend through the entire thickness of the planar element leaving the center of the element open. Advantageously, the inner edges of the recessed areas conform along at least two opposite sides of the recess to the edges of the substrates, thus permitting the location of the substrates in the recesses. When desired, the inner edges of the recesses can be provided with brackets serving to support the substrate. In the latter case the broad walls of the reaction chamber pack are formed by substrates placed into the center openings of the planar elements, whereby the substrates may be aligned so as to, e.g., have the substrate top sides facing each other.

The above-described apparatus construction details make it possible to reduce the weight of the reaction space and minimize the number of components in the system. By arranging the reaction space to comprise vertically or horizontally stacked reaction spaces, the length of the gas inflow and outflow channels, respectively, can be reduced. This is particularly true for the latter case in which the substrates themselves serve as the broad walls of the reaction chambers.

The invention provides significant benefits over prior-art ALE reactors. Accordingly, the pulsing concept of the starting materials based on never having two or more different starting material species transported in the system simultaneously effectively isolates the starting materials from each other thus preventing their premature mutual reactions. Should such reactions occur in the gas phase, CVD thin film growth would result, whereby the reactor deviates from the operating conditions of the ALE process and the reactor cannot be called an ALE reactor any more. In fact, the CVD thin film growth condition in conventional ALE reactors often causes the formation of the detrimental microparticle dust/spalling.

According to the invention, the risk of CVD thin film growth is eliminated thereby yielding true surface-controlled thin film growth, and thus, excellent ALE process qualities; in fact, the apparatus according to the invention realizes the separate reaction steps characterizing a true ALE process.

The minimized surface areas and volumes also minimize the amount of extra thin film growth in the piping, whereby the rate of dust/spall formation and need for cleaning are reduced. The small gas volume with optimized fluid dynamics speeds the through-flow of gases and improves the purging of gases participating in the reactions, which is evidenced as faster process rate and improved thin film quality.

The evacuation steps and possible complementing step of flushing with an inactive gas also contribute to the efficient removal of molecules adsorbed on the inner walls of the system and thus lessen the tendency of the molecules to react with the molecule species of the successive reactant pulse.

BRIEF DESCRIPTION OF THE DRAWINGS

In the following the invention will be examined in greater detail with reference to the appended drawings in which.

DETAILED DESCRIPTION OF THE PREFERRED EMBODIMENTS

Figure 1:
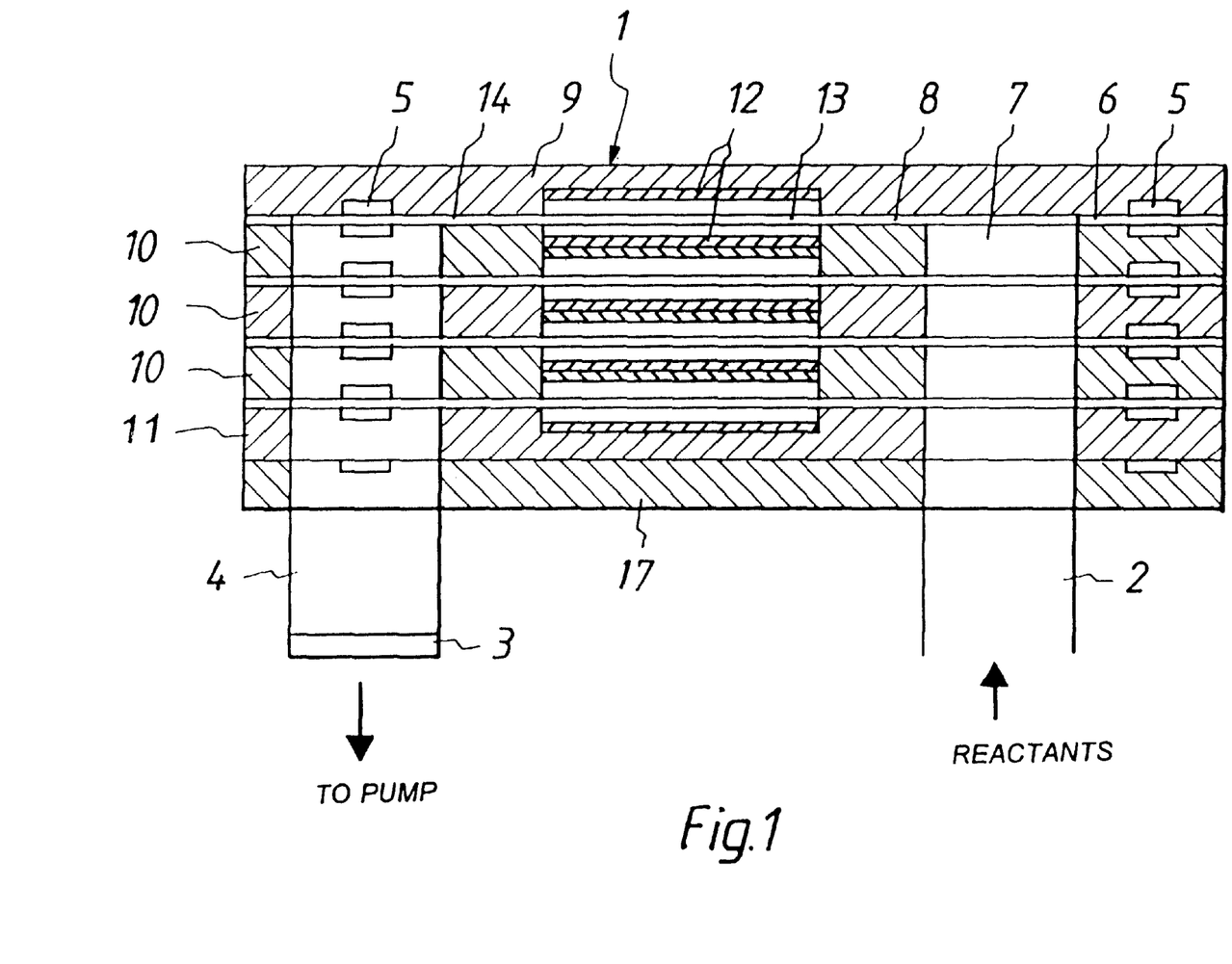
FIG. 1 is a longitudinally sectioned side view of a simplified structure for the reaction chamber pack in a first embodiment according to the invention.

Referring to FIG. 1, the apparatus construction shown therein comprises a reaction space, or a reaction chamber pack 1, assembled from mutually identical, stacked planar elements 10, in which pack the gas flow channels 7, 4 and reaction chambers 13 are formed by openings and notches made to the planar elements. The apparatus is shown to incorporate four reaction chambers 13 having placed therein eight substrates 12 onto which thin films are grown using the ALE process. Reference numeral 3 denotes the connection of the reaction chamber pack to a pipe communicating with the inlet of a pump. The connection communicates with the outflow channel 4 of vapor-phase reaction products and excess reactants, whereby the outflow channel acts as collecting manifold for the outflows from the reaction chambers. Correspondingly, reference numeral 2 denotes the inflow opening for vapor-phase reactants, whereby said inflow opening further communicates with the reactant inflow channel 7.

The planar elements are provided with an encircling suction groove 5 for collecting any gas leaks. The suction groove communicates with the outflow channel 4. The purpose of the suction groove is to avoid the access of external contamination into the reaction space and to prevent reactants from leaking outside the reaction space. Thence, the groove acts as an isolating gas seal for the reaction space.

When stacking the planar elements, between each two superimposed elements is placed an intermediate plate 6 suited for controlling the restriction of the gas flow by setting the cross section of the inlet slit 8 from the inflow channel 7 into the reaction chamber 13 and the cross section of the outlet slit 14 that is, gas flow restriction, from the reaction chamber to the outflow channel 4.

The upper half of the uppermost reaction chamber acts as the top plate 9 of the reaction chamber pack, and correspondingly, the lower half of the lowermost reaction chamber acts as the bottom plate 11, which is mounted onto a support base 17. Between said top plate and bottom plate are stacked three mutually identical planar elements 10. Each planar element forms firstly in combination with the substrate 12 the wall between two adjacently stacked reaction chambers, and secondly, in combination with the intermediate plates 6 and other auxiliary plates, forms the inflow and outflow channels 7, 4. The number of the planar elements may be varied in the range 0–100 pcs.

The inflow/outflow channels 7, 4 and the reaction chambers are shaped to have longitudinally a narrow, oblong cross section to facilitate a "flattened" gas flow and minimize the volume of the reaction space.

In the embodiment illustrated in FIG. 1, the vapor-phase reactant pulses of different reactant groups are fed alternately into the inflow channel 7. Prior to the feed, the gas inflow pulses are homogenized with an inactive gas flow in the inflow channel 7 or before. In the inflow channel, shown longitudinally sectioned in the diagram, the vapor-phase reactant pulse travels flattened into a planar shape which proceeds along the channel with a defined leading front. The flow front has a width equal to the that of the substrate, which is approx. 10–30 cm, for instance, while the thickness of the front is approx. 1–3 cm.

The flow travelling in the inflow channel is distributed evenly between the in-parallel stacked reaction chambers 13 by dimensioning the reaction space with its gas flow restrictions so that the flow conductance of the inflow channel 7 is much higher than the flow conductance via the reaction chambers 13. The flow path through each reaction chamber must have a conductance which is equivalent (equal) to that of the gas paths via the other chambers. Then the pressure and flow rate is balanced between the individual reaction chambers, and thence, the thin film growth rate is also equal in the separate chambers. Inside the reaction chamber 13, the flow pattern is equalized by virtue of the narrow suction slit 14 formed to the outflow end of the reaction chamber. The suction slit may be formed by either a single, contiguous slit or a plurality of small, parallel slits which in the exit direction of the flow is/are preceded by the large-volume reaction chamber 13 having a larger relative flow conductance than that of the slit(s). Then, the gas flow tends to exit via the slit(s) in an equally distributed pattern. In the reaction chamber 13 this is manifested as an equalized cross-directional pressure gradient of the leading edge of the propagating gas pulse meaning an equalized propagating gas front. In tests (with reduced reactant dosing) the gas front has been found to have an extremely straight contour.

Ensuring the equalized cross-directional outflow pattern of gas front is extremely important, because the gas molecules tend to travel toward the direction of lowest pressure, most effective suction, whereby the straight gas front will be distorted if subjected to a nonhomogeneous suction. Moreover, a homogeneous suction effect will rectify a gas front distorted due to other possible reasons.

After the exit of the vapor-phase reactants from the reaction chamber and particularly the reaction space, their possible mixing how complete whatsoever will not cause harm to the thin film being grown.

Figure 2:
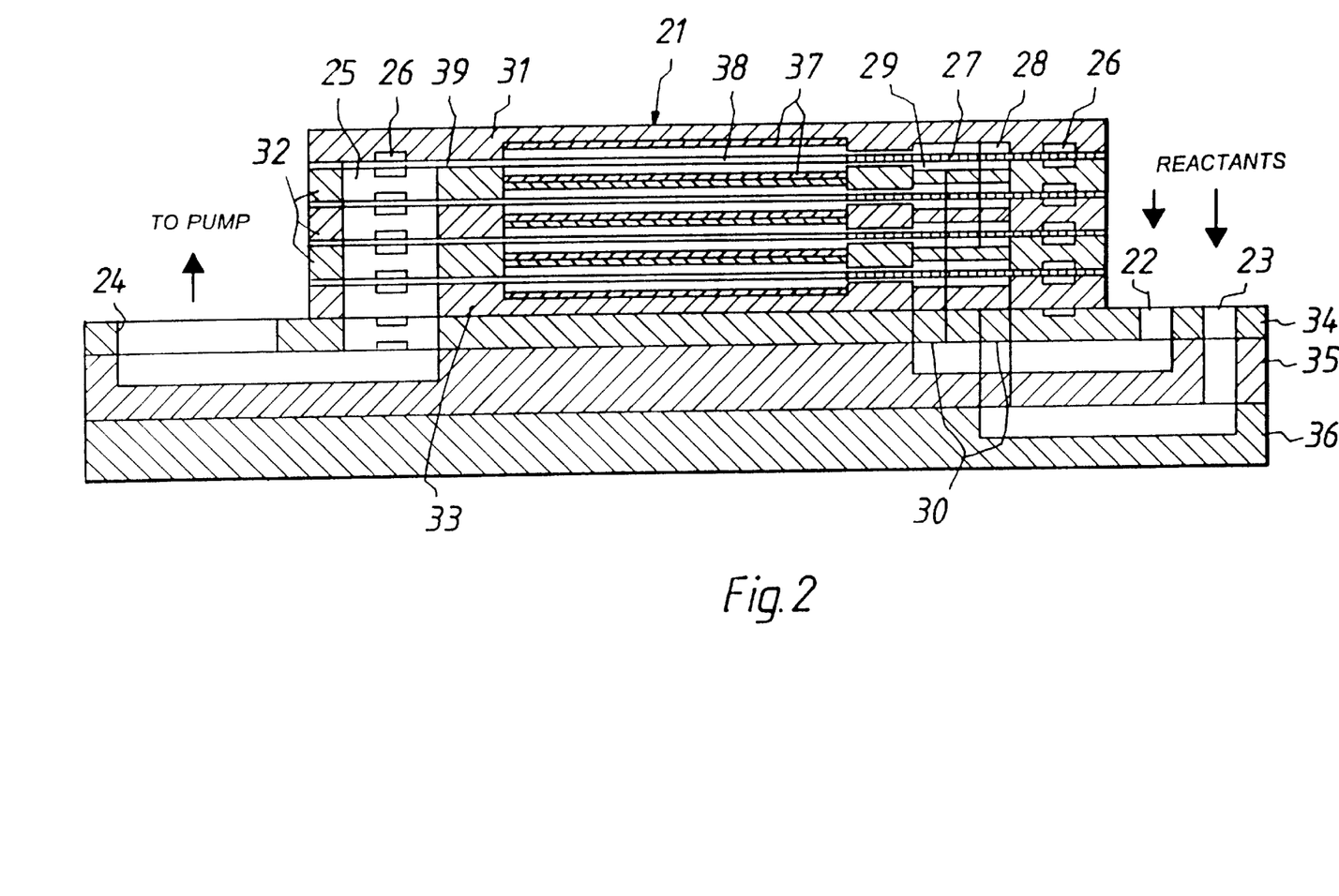
FIG. 2 is a longitudinally sectioned side view of a simplified structure for the reaction space construction in a second embodiment according to the invention.

Referring to FIG. 2, an embodiment slightly different from that described above is shown. The legend of reference numerals in the diagram is as follows:

21. Reaction chamber pack
22. Inflow duct opening for starting materials of group A
23. Inflow duct opening for starting materials of group B
24. Connection for pipe communication with suction inlet of pump
25. Collecting outflow channel for outflow slits from in-parallel stacked reaction chambers
26. Suction groove encircling the planar element for collection of possible gas leaks, whereby the suction groove communicates with the collecting outflow channel.
27. Intermediate plate serving for setting of outflow slit height, that is, gas flow restriction. In addition to its function as setting the outflow restriction, the intermediate plate forms a baffle separating the different starting material groups at the inflow side.
28. Inflow channel for starting materials of group B
29. Inflow channel for starting materials of group A
30. Inflow channel serving for the distribution of the starting material flows to the paralleled reaction chambers
31. Top plate and one half of the uppermost reaction chamber
32. 0–100 pcs. identical planar elements. Each planar element in combination with the substrate forms the separating wall between two superimposed reaction chambers as well as the inflow and outflow channels in combination with the intermediate plates and the other auxiliary plates.
33. Bottom plate and one half of the lowermost reaction chamber
34. Uppermost plate of support base
35. Middle plate of support base
36. Lowermost plate of support base
37. Substrates
38. Reaction chamber
39. Restriction for gas flow leaving the substrate.

The embodiment shown in FIG. 2 is used in the same fashion as that illustrated in FIG. 1. However, this construction differs from first embodiment in that the starting materials of different reactant groups are taken along their own inflow channels up to the inflow slits of the reaction chambers. Hence, the reaction chamber pack is assembled onto such a support base plate set 34–36 which after their stacking provide individual flow ducts 22, 23 for the reactants of the different starting material groups. Similarly, the reactants travel in their individual inflow channels 28, 29 at the side of the reaction chamber pack.

The gases are fed from the inflow channels 28, 29 separated by the baffles 27 formed by the intermediate plates, whereby the height of the reaction chamber is dimensioned so that diffusion performs efficient intermixing of the flows entering from the different channels. While diffusion is a too slow mixing method to be used in the width direction of the flattened gas flow pattern, it performs well in the height direction. Thus, when the reactant is fed from one inflow channel 28, for instance, the inactive gas is fed from the other channel 29. When impinging on the baffles, the reactant and inactive gas flows, respectively, are flattened assuming a planar flow pattern, whereby they are homogenized during their intermixing in the inflow slit of the reaction chamber.

The inflow ducts 22, 23 and the inflow channels 28, 29 may have a circular cross section, for instance, and the reactant gas flows are spread into a fanned and flattened shape only at the baffles.

Analogously with the first embodiment, securing the equalized cross-directional outflow pattern of the gas front is extremely important.

Still referring to FIG. 2, it must be noted that the positions of the inflow channels 28 and 29 are slightly displaced for clarity. In a practical embodiment, these inflow channels are arranged in parallel, that is, adjacent in the lateral direction, whereby their infeed openings into the reaction chamber will be located at the same distance from the substrate.

EXAMPLE

The following example describes the design principles for the pump of the apparatus shown in FIG. 1 and the interval between the successive vapor-phase reactant pulses, respectively, that make the apparatus perform in accordance with the invention:

| | |
|---|---|
| Substrate size | 300 × 300 mm$^2$ |
| Number of substrates | 10 pcs. |
| Number of reaction chambers | 5 pcs. |
| Spacing between substrates | 4 mm |
| Total volume of reaction chambers | 5 × 300 × 300 × 4 mm$^3$ = 1,800 cm$^3$ |
| Dimensions/volume of inflow channels | 300 × 10 × 100 mm = 300 cm$^3$ |
| Dimensions/volume of outflow channels | 300 × 10 × 100 mm = 300 cm$^3$ |

Total volume 2,400 cm$^3$, or approx. 2.4 L.

The pump capacity is selected as 360 m$^3$/h, or 360×1000/3600 (l/s)=100 l/s Hence, the above-calculated total gas volume can be evacuated with a pump so dimensioned in approx. 0.024 s.

A pump with the above-calculated capacity requires a pumping line with an inner diameter of 76 mm, having a volume per length unit of π×0.38×0.38×10 dm$^3$=4.07 l/min, which means that if the length of the pumping line from the reaction chamber pack to the outlet connection of the apparatus is 1 m, for instance, its evacuation takes an extra time of 0.04 s.

Accordingly, the interval between the reactant pulses in the above example is selected as approx. 0.25 s, which is a sufficient time for one-time evacuation of the entire gas volume of the apparatus during the interval between two successive reactant pulses. By extending the interval between the pulses to 1 s, for instance, the total gas volume can he evacuated approx. 4 times. Here, an inactive gas may advantageously be introduced to the reaction space during the evacuation.

We claim:

1. An apparatus for growing a solid-state thin film onto a substrate by subjecting the substrate to alternately repeated surface reactions of at least two different vapor-phase reactants, the apparatus comprising:
   a reaction space defining a volume, including a reaction chamber configured to support the substrate therein;
   at least one inflow channel alternately communicating the at least two reactants to the reaction space;
   a reactant outflow channel communicating reaction products and excess amounts of reactants from the reaction space;
   a pump communicating with the outflow channel to evacuate gases from the reaction space; and
   controls set to deliver the at least two reactants through the at least one inflow channel to the reaction space in alternate pulses with a fixed interval between successive reactant pulses during which purge gas is provided to the reaction space, and wherein the controls are set for the pump to remove greater than two reaction space volumes of purge gas from the reaction space during each fixed interval.

2. The apparatus of claim 1, wherein the controls are set for the pump to remove at least three reaction space volumes of purge gas from the reaction space during each fixed interval between successive reactant pulses.

3. The apparatus of claim 2, wherein each fixed interval between successive reactant pulses is on the order of 1 second.

4. The apparatus of claim 1, wherein the controls are set for the pump to remove four to ten reaction space volumes of purge gas from the reaction space during each fixed interval between successive reactant pulses.

5. The apparatus of claim 4, wherein each fixed interval between successive reactant pulses is on the order of 1 second.

6. The apparatus of claim 1, wherein at least a portion of the gas inflow and outflow channels forming a part of the reaction space are provided with a narrow, oblong cross-section orthogonal to a direction of gas flow in order to minimize the volume of the reaction space.

7. The apparatus of claim 6, wherein the oblong portion of the gas inflow and outflow channels has a ratio of channel width to channel height between about 5:1 and 50:1, wherein both height and width are orthogonal to a direction of gas flow.

8. The apparatus of claim 7, wherein the inflow channel includes an infeed opening that defines a gas flow front entering the reaction chamber with a width between about 10 cm and 30 cm.

9. The apparatus of claim 8, wherein the gas flow front has a height between about 1 cm and 3 cm.

10. The apparatus of claim 1, wherein the gas inflow channel is dimensioned to have a higher flow conductance than the reaction chamber.

11. The apparatus of claim 10, wherein the gas inflow channel feeds reaction gas to a plurality of parallel reaction chambers.

12. The apparatus of claim 10, wherein the reaction space includes a narrow suction slit downstream of the reaction chamber, the suction slit serving as a gas flow restriction.

13. The apparatus of claim 1, wherein the gas inflow channel includes a baffle separating a first infeed opening from a second infeed opening, the first infeed opening communicating a first reactant pulse to the reaction chamber and the second infeed opening communicating a second reactant pulse to the reaction chamber.

14. The apparatus of claim 13, wherein the gas inflow channel is arranged to impinge reactant gas generally perpendicularly upon the baffle prior to entering the reaction chamber.

15. The apparatus of claim 13, arranged to flow inactive gas through the second infeed opening while the first reactant flows through the first infeed opening.

16. The apparatus of claim 15, arranged to flow inactive gas through the first infeed opening while the second reactant flows through the second infeed opening.

17. The apparatus of claim 1, configured to reduce residual components in the reaction space from a first vapor-phase reactant pulse to less than 0.1% prior to an immediately subsequent reactant pulse.

18. The apparatus of claim 1, configured to reduce residual components in the reaction space from a first vapor-phase reactant pulse to less than 1% prior to an immediately subsequent reactant pulse.

19. An apparatus for growing a solid-state thin film on a substrate, the apparatus comprising:
   a reaction space having a volume within which a substrate is supported;
   a pump having the volumetric capacity to pump greater than twice the volume of the reaction space in 1 second; and
   controls set to:
      deliver at least two reactants to the reaction space in alternate pulses;
      supply purge gas to the reaction space in an interval of about one second between the pulses of reactants; and
      pump at least two reaction space volumes of purge gas from the reaction space during the interval between reactant pulses.

* * * * *